United States Patent
Yamada et al.

(10) Patent No.: US 8,644,058 B2
(45) Date of Patent: Feb. 4, 2014

(54) SPIN-INJECTION ELEMENT, AND MAGNETIC FIELD SENSOR AND MAGNETIC RECORDING MEMORY EMPLOYING THE SAME

(75) Inventors: Masaki Yamada, Sendai (JP); Hiromasa Takahashi, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 26 days.

(21) Appl. No.: 13/389,016

(22) PCT Filed: Aug. 4, 2010

(86) PCT No.: PCT/JP2010/004902
§ 371 (c)(1),
(2), (4) Date: Feb. 6, 2012

(87) PCT Pub. No.: WO2011/033716
PCT Pub. Date: Mar. 24, 2011

(65) Prior Publication Data
US 2012/0133008 A1      May 31, 2012

(30) Foreign Application Priority Data

Sep. 16, 2009   (JP) ................................. 2009-214450

(51) Int. Cl.
*G11C 11/00*   (2006.01)
*G11C 11/16*   (2006.01)

(52) U.S. Cl.
CPC ...................................... *G11C 11/16* (2013.01)
USPC ............. 365/158; 365/171; 365/173; 365/97; 365/50

(58) Field of Classification Search
CPC ............................ G11C 11/15; G11C 11/5607
USPC ............... 365/171, 158, 173, 50, 97
See application file for complete search history.

(56) References Cited

U.S. PATENT DOCUMENTS 7,969,692 B2 *   6/2011   Takahashi ..................... 360/324
2004/0257714 A1   12/2004   Takahashi et al.
(Continued)

FOREIGN PATENT DOCUMENTS

| JP | 2004-186274 | 7/2004 |
| JP | 2007-299467 | 11/2007 |

(Continued)

OTHER PUBLICATIONS

F. J. Jedema et al, Electrical detection of spin precession in a metallic mesoscopic spin valve, Nature, Apr. 18, 2002, pp. 713-716, vol. 416, www.nature.com.

(Continued)

*Primary Examiner* — Thong Q Le
(74) *Attorney, Agent, or Firm* — Antonelli, Terry, Stout & Kraus, LLP.

(57) ABSTRACT

Provided are a spin-injection element having high spin-injection efficiency, and a magnetic field sensor and a magnetic recording memory employing the element. The element comprises a barrier layer, a magnetic conductive layer, and a spin accumulation portion comprised of non-magnetic conductive material. In the element, a first spin accumulation layer (103) and the barrier layer (102) have respectively a body-centered cubic lattice structure. Due to this, the first spin accumulation layer (103) and the barrier layer (102) come into contact with each other through a boundary face with improved crystalline symmetry. Thereby, lattice matching is improved and scattering of the tunnel electrons in the $\Delta 1$ band is prevented, resulting in improvement in the spin polarizability. Further, the characteristics of the device employing the spin injection element are improved.

14 Claims, 14 Drawing Sheets

(56) References Cited

U.S. PATENT DOCUMENTS

| | | |
|---|---|---|
| 2006/0022220 A1 | 2/2006 | Inomata et al. |
| 2007/0253116 A1 | 11/2007 | Takahashi |
| 2008/0217711 A1 | 9/2008 | Sugiyama et al. |

FOREIGN PATENT DOCUMENTS

| | | |
|---|---|---|
| JP | 4082274 | 2/2008 |
| JP | 2008-226901 | 9/2008 |
| JP | 2009-54880 | 3/2009 |

OTHER PUBLICATIONS

F. J. Jedema et al, Spin injection and spin accumulation in all-metal mesoscopic spin valves, Physical Review B 67, 085319 (2003).

S. Takahashi et al., Spin injection and detection in magnetic nanostructures, Physical Review B 67, 052409 (2003).

Office Action issued in Japanese Patent Application No. 2011-531771 on Aug. 6, 2013.

* cited by examiner

RECORDING MEDIUM

FIG. 9EA
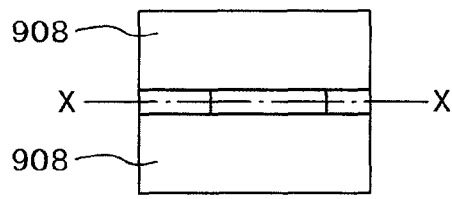
FIG. 9EB
FIG. 9EC
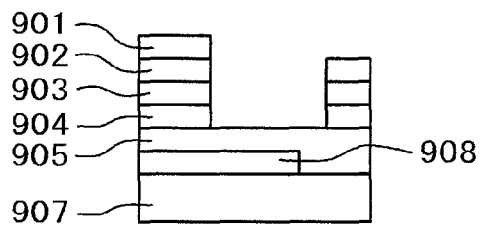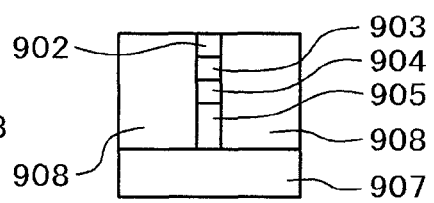
FIG. 9FA
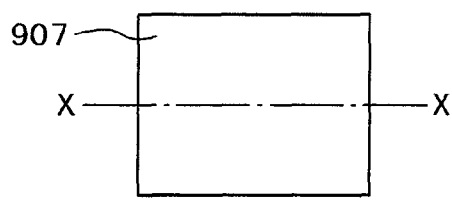
FIG. 9FB
FIG. 9FC
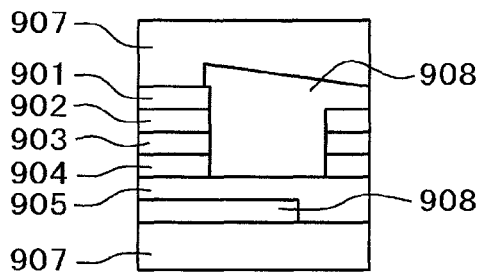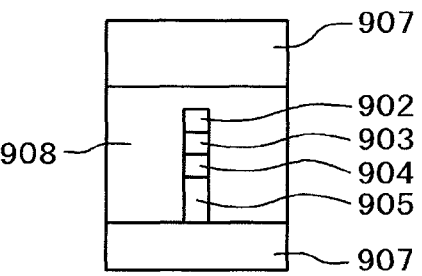

FIG. 11BA
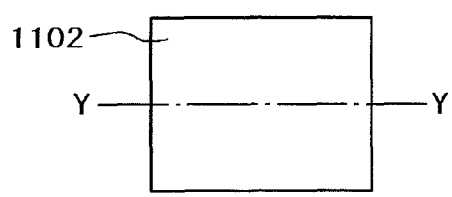
FIG. 11BB
FIG. 11BC
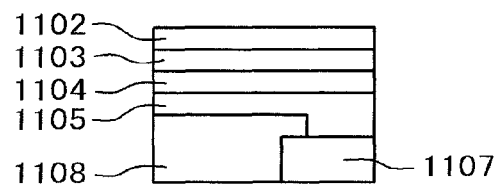 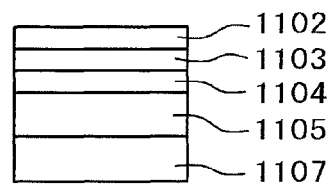
FIG. 11CA
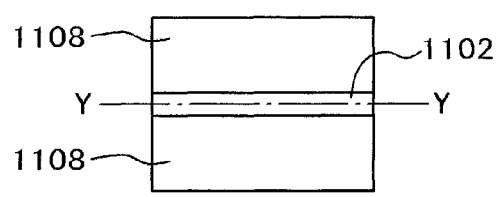
FIG. 11CB
FIG. 11CC
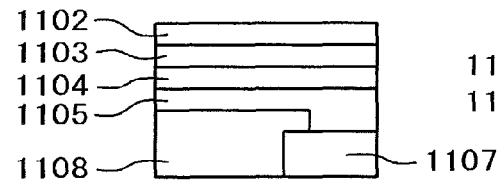 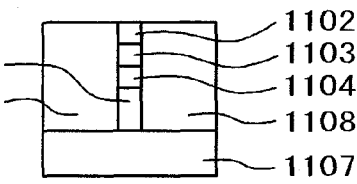

FIG. 11DA
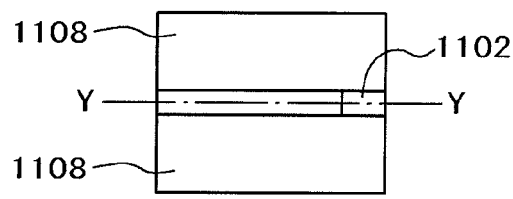
FIG. 11DB
FIG. 11DC
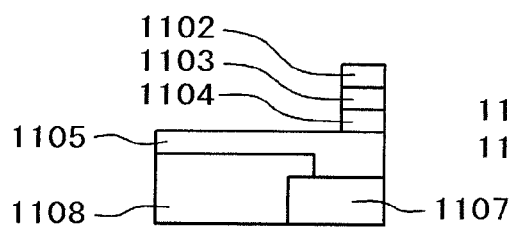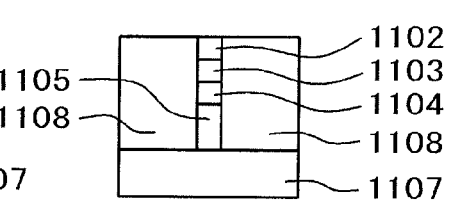
FIG. 11EA
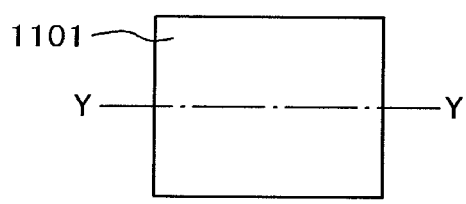
FIG. 11EB
FIG. 11EC
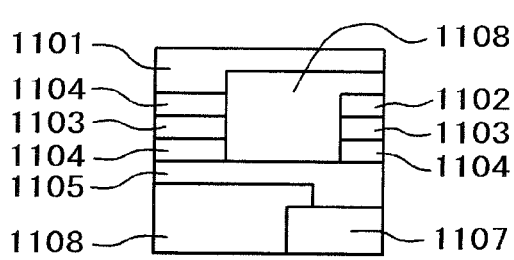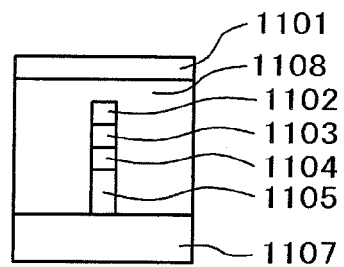

FIG. 16
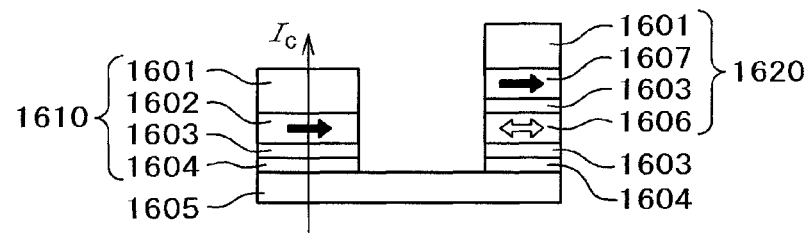
FIG. 17A
FIG. 17B
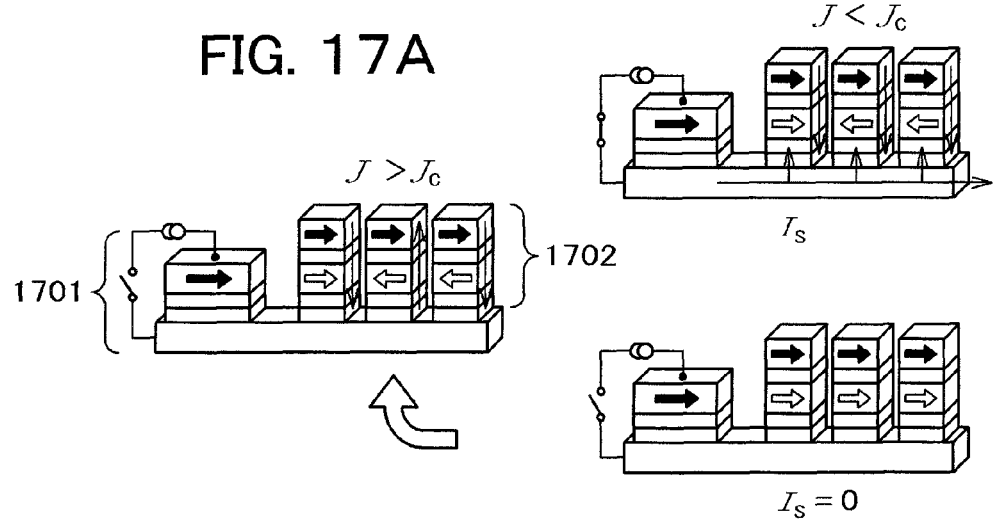

SPIN-INJECTION ELEMENT, AND MAGNETIC FIELD SENSOR AND MAGNETIC RECORDING MEMORY EMPLOYING THE SAME

TECHNICAL FIELD

The invention relates to a spin-injection element, and a magnetic field sensor and a magnetic recording memory employing the same.

BACKGROUND ART

In the market for magnetic recording and reproducing apparatus, improvement in the recording density exceeding 40% per year has been demanded and it is estimated that the recording density will reach Tbit (terabit)/in$^2$ (square inch) about in the year of 2011 in accordance with the growing rate at present. For the terabit class magnetic recording apparatus, increase in power and resolution performance is inevitable in magnetic recording and reproducing heads.

In the current magnetic recording and reproducing apparatus, a CPP-GMR (Current Perpendicular to Plane Giant Magnetic Resistance) head and a TMR (Tunneling Magneto Resistance) head that flow a sense current perpendicular to stacking surface is proposed as a constituent element thereof. The spin valve type reproducing apparatus described above use a magnetic body (free layer) as a detection method of a leak magnetic field from a medium and it shows resistance change with respect to a relative magnetization direction to a magnetic body magnetically pinned in one direction (pinned layer).

For improving the resolution power of the current CPP-GMR head and the TMR head, it is necessary to reduce the thickness of constituent films. Particularly, as the bit length decreases, a gap width Gw should be narrower in order to obtain a high resolution power. For example, Gw=18 nm in a reproducing head to a medium at 2 Tbit/in$^2$ and the total thickness for the device constituent films should be 18 nm or less.

Then, for a hard disk having a terabit class surface recording density, an external magnetic field sensor having a feature of high resolution power and a high output is necessary. As the external magnetic sensor having the high resolution power and with low noises, a reproducing head applying a spin accumulation effect has been proposed (for example, in Patent Literature 1).

The spin accumulation effect is a phenomenon that when a current flows from a ferromagnetic body to a non-magnetic metal, spin polarized electrons are accumulated in the non-magnetic metal within a range of a spin diffusion length. The spin diffusion length represents a distance in which spin information is lost (spin is inversed), and this is a value inherent to a substance.

The effect is attributable to that when a current flows from a ferromagnetic body to a non-magnetic metal, spin polarized electrons (spin electrons) are injected and the chemical potential is different between the up spin electrons and down spin electrons since a ferromagnetic body generally has a different spin density at the Fermi level (number of electrons is different between the up spin electrons and down spin electrons). It has been known that the non-magnetic conductor behaves ferromagnetically within a spin diffusion length due to the accumulated spin electrons (for example, refer to Non Patent Literatures 1, 2)

The reproducing head that utilizes the effect uses a spin current-injected magnetic body as a pinned layer and the other magnetic body as a free layer opposing to a recording medium. Due the spin accumulation effect, since the pinned layer and the free layer can be disposed at positions spaced apart within a range of the diffusion length (distance in which spin information can be transmitted), the inter-shield distance (gap length) opposing to the recording medium can be narrowed. Further, since current does not flow directly to the sensing portion of the free layer, there is a possibility capable of decreasing Johnson noises, etc.

The output voltage difference $\Delta V$ due to the spin accumulation effect utilizing magnetic tunneling conduction is represented by the following formula (Non Patent Literature 3).

[Formula 1]

$$\Delta V = \frac{P^2 \lambda_N}{A_N \sigma_N} \exp\left(-\frac{d}{\lambda_N}\right) \quad (1)$$

where
P: spin polarization rate,
$\lambda_N$: spin diffusion length of an non-magnetic body,
d: distance between two magnetic bodies,
$A_N$: a cross sectional area of a non-magnetic body,
$\sigma_N$: electric conductivity of the non-magnetic body.

In accordance with the equation, for improving the output voltage, 1. improvement in the spin polarization rate, 2. increase in the spin diffusion length, and 3. refinement of a device are important factors. Among them, improvement in the spin polarization rate is an important factor for the increase in the output voltage difference.

CITATION LIST

Patent Literature

Patent Literature 1: JP No. 4082274

Non Patent Literature

Non Patent Literature 1: F. J. Jedema, and other four, "Electrical detection of spin precession in a metallic mesoscopic spin valve". Nature, vol. 416 (2002), pp. 713-716.

Non Patent Literature 2: F. J. Jedema, and other three, "Spin injection and spin accumulation in all-metal mesoscopic spin valves". Phys. Rev. B. vol. 67, (2003), pp. 85319-85319 (16).

Non Patent Literature 3: S. Takahashi and S. Maekawa, "Spin injection and detection in magnetic nanostructures", Phys. Rev. B. vol. 67 (2003), pp. 52409(1)-52409(4)

SUMMARY OF INVENTION

Technical Problem

Generally, the spin polarization rate showing the injection efficiency of spin electrons greatly depends on tunnel conduction in a barrier layer, and a large spin polarization rate is shown when band electrons in a magnetic body cause tunnel conduction while maintaining coherency thereof as it is.

For example, in the tunneling phenomenon of Fe/MgO/Fe by way of an Mg0 barrier layer can obtain an extremely large value for the spin polarization rate as high as 0.8 since electrons in the Δ1 band of Fe conduct tunneling while keeping the coherency in the MgO band. However, the spin diffusion length of Fe is small and application to magnetic sensors, etc.

is difficult. On the other hand, a high spin polarization rate cannot be obtained in Cu having a large diffusion length.

It is an object of the present invention to provide a spin injection element of high spin injection efficiency, and a magnetic sensor and a magnetic recording memory using the same.

Solution to Problem

As an embodiment for attaining the object described above, there is provided a spin injection element comprising a non-magnetic conductor layer, a barrier layer stacked over the non-magnetic conductor layer, a magnetic conductor layer stacked over the barrier layer, and a circuit for flowing a current between the magnetic conductor layer and the non-magnetic conductor layer, in which the boundary between the non-magnetic conductor layer and the barrier layer, and the boundary between the magnetic conductor layer and the barrier layer have a structure where they are in contact each at a surface having a crystal symmetricity.

Further, there is provided a spin injection element comprising a first non-magnetic conductor layer, a second non-magnetic conductor layer stacked over the first non-magnetic conductor layer, a barrier layer having a body-centered cubic lattice structure and laminated over the second non-magnetic conductor layer, a third non-magnetic conductor layer stacked over the barrier layer, a fourth non-magnetic conductor layer of a large atomic number stacked over the third non-magnetic conductor layer, and a circuit for supplying a current in the direction of the film surface of the fourth non-magnetic conductor layer, in which the second non-magnetic conductor layer has a body-centered cubic lattice structure of a thickness less than the spin diffusion length in the second non-magnetic conductor layer, and the third non-magnetic conductor layer has a body-centered cubic lattice structure of a thickness less than the spin diffusion length in the third non-magnetic conductor layer.

Further, there is provided a magnetic field sensor comprising a first non-magnetic semiconductor layer, a pinned layer in which a second non-magnetic conductor layer having a body-centered cubic lattice structure, a first barrier layer having a body-centered cubic structure, and a first magnetic conductor layer magnetically pinned in one direction are stacked in this order over a first region of the first non-magnetic conductor layer, a free layer in which a third non-magnetic conductor layer having a body-centered cubic lattice structure, a second barrier layer having a body-centered cubic lattice structure, and a second magnetic conductor layer where the direction of magnetization changes by the external magnetic field are stacked in this order over a second region of the first non-magnetic conductor layer, a current applying circuit for flowing a current between the first magnetic conductor layer and the first non-magnetic conductor layer, and an electric circuit for detecting a potential difference between the first non-magnetic conductor layer and the second magnetic conductor layer, in which the first region and the second region are disposed within the range of the spin diffusion length in the first non-magnetic conductor layer.

Further there is provided a magnetic recording memory comprising a non-magnetic conductor layer having a body-centered cubic structure, a stacked film comprising a first barrier layer having a body-centered cubic lattice structure and stacked over the non-magnetic conductor layer, a first magnetic conductor layer having a body-centered cubic structure and stacked over the first barrier layer, a second barrier layer having a body-centered cubic lattice structure and stacked over the first magnetic conductor layer, and a second magnetic conductor layer having a body-centered cubic structure and stacked over the second barrier layer, and a current supplying circuit for flowing a current between the non-magnetic conductor layer and the second magnetic conductor layer, in which the thickness of the non-magnetic conductor layer is less than the spin diffusion length in the non-magnetic conductor layer and magnetization in the second magnetic conductor layer is magnetically pinned in one direction and spin electrons injected to the boundary between the first barrier layer and the first magnetic conductor layer assist the switching of magnetization in the first magnetic conductor layer.

There is further provided a magnetic recording memory comprising a first non-magnetic conductor layer, an initialization mechanism portion including stacked films where a second non-magnetic conductor layer having a body-centered cubic lattice structure, a first barrier layer having a body-centered cubic lattice structure, and a first magnetic conductive layer magnetically pinned in one direction stacked are in this order over and electrode terminals disposed to each of the first magnetic conductor layer and the first non-magnetic conductor layer for flowing a current between the layers over a first region of the first non-magnetic conductor layer, and plural memory cells disposed within a range of the spin diffusion length in the first non-magnetic layer over a second region of the first non-magnetic layer.

Advantageous Effects Of Invention

A spin injection element having a high spin injection efficiency, and a magnetic field sensor and a magnetic recording memory using the same can be provided.

BRIEF DESCRIPTION OF DRAWINGS

FIG. 9EA, FIG. 9EB, and FIG. 9EC are schematic views showing manufacturing steps of the magnetic field sensor using the second spin accumulation element according to the second embodiment in which FIG. 9EA is a plan view, FIG. 9EB is a cross sectional view along X-X in the plan view, and FIG. 9EC is a right side elevational view.

FIG. 9FA, FIG. 9FB, and FIG. 9FC are schematic views showing manufacturing steps of the magnetic field sensor using the second spin accumulation element according to the second embodiment in which FIG. 9FA is a plan view, FIG. 9FB is a cross sectional view along X-X in the plan view, and FIG. 9FC is a right side elevational view.

FIG. 11BA, FIG. 11BB, and FIG. 11BC are schematic views showing manufacturing steps of the magnetic sensor using the third spin accumulation element according to the third embodiment in which FIG. 11BA is a plan view, FIG. 11BB is a cross sectional view along X-X in the plan view, and FIG. 11BC is a right side elevational view.

FIG. 11CA, FIG. 11CB, and FIG. 11CC are schematic views showing a manufacturing step of the magnetic sensor using the third spin accumulation element according to the third embodiment in which FIG. 11CA is a plan view, FIG. 11CB is a cross sectional view along X-X in the plan view, and FIG. 11CC is a right side elevational view.

FIG. 11DA, FIG. 11DB, and FIG. 11DC are schematic views showing manufacturing steps of the magnetic sensor using the third spin accumulation element according to the third embodiment in which FIG. 11DA is a plan view, FIG. 11DB is a cross sectional view along X-X in the plan view, and FIG. 11DC is a right side elevational view.

FIG. 11EA, FIG. 11EB, and FIG. 11EC are schematic views showing manufacturing steps of the magnetic sensor using the third spin accumulation element according to the third embodiment in which FIG. 11EA is a plan view, FIG. 11EB is a cross sectional view along X-X in the plan view, and FIG. 11EC is a right side elevational view.

FIG. 16 is a schematic cross sectional view of a magnetic recording memory having an initialization mechanism applying the spin device according to the first embodiment.

FIG. 17A, FIG. 17B are schematic perspective views for explaining the erasing operation of the magnetic recording memory having the initialization mechanism shown in FIG. 16 in which FIG. 17A shows operation during recording, and FIG. 17B shows operation upon erasion.

DESCRIPTION OF EMBODIMENTS

Figure 1:
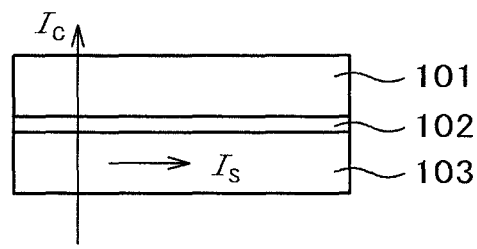
FIG. 1 is a schematic cross sectional view of a first spin injection element according to a first embodiment.

The present inventors have investigated a reason why a spin polarization rate is high in a Fe/MgO/Fe structure but no large value cannot be obtained in Fe/MgO/Cu. As a result, it has been found that the spin polarization rate showing the injection efficiency of spin electrons is higher as the symmetricity of crystal structure is higher between a non-magnetic conductor (Fe or Cu) and a barrier layer (MgO).

That is, it is considered in the case of Fe/MgO/Fe that the symmetricity of crystal structure between the magnetic conductor at a spin injection portion and the crystalline barrier layer is high and, accordingly, tunneling is caused between the bands. However, the spin polarization rate lowers when the symmetricity of crystals between the magnetic conductor to which the spins are injected and the barrier layer is worsened.

On the other hand, when considering spin injection to a non-magnetic conductor such as Cu represented by the spin accumulation effect, the spin polarization rate lowers due to mismatching of the crystal structure between the spin electron-injected non-magnetic conductor and the barrier layer (low symmetricity of crystal structure).

It is known that the crystal structure of a material generally having a long spin diffusion length (for example, Cu and Al) has a face-centered cubic structure and since this is different from a body-centered cubic structure of the Mg0 barrier layer, scattering of tunnel electrons is increased at the boundary between the non-magnetic conductor and the barrier layer to lower the transmission probability of the tunnel electrons. As a result, effective spin polarization rate lowers and the output voltage difference also lowers.

The present invention has been achieved based on the finding described above and intends to improve the symmetricity of the crystal structure forming an optimal interface thereby improving the spin polarization rate when spins are injected from the magnetic conductor to the non-magnetic conductor.

An example of this configuration has a structure of injecting spin electrons from a magnetic conductor having a body-centered cubic lattice structure to a non-magnetic body having a body-centered cubic lattice structure by way of an MgO barrier, and accumulating spin electrons in the non-magnetic body having the body-centered cubic lattice structure.

That is, in a spin injection element using an MgO barrier layer for a non-magnetic conductor of a long spin diffusion length, spin polarization rate lowers due to mismatching for the symmetricity of crystals (low symmetricity of crystal structure). However, when the structure described above is adopted, since the lattice matching is improved between the MgO barrier layer and the body-centered cubic lattice structure, scattering of tunnel electrons at the boundary in the Δ1 band can be suppressed to increase the spin polarization rate. Therefore, the efficiency of spin injection into the non-magnetic body is improved to improve characteristics of the device using spin electrons such as increase in the output.

A spin injection element, and a magnetic reproducing sensor, a magnetic recording apparatus and a magnetic recording memory utilizing the same are to be described specifically by way of embodiments.

First Embodiment

A first embodiment is to be described with reference to FIG. 1 to FIG. 7 and FIG. 14 to FIG. 18.

FIG. 1 is a schematic cross sectional view of a first spin injection element according to this embodiment. In a spin injection element to a first non-magnetic body, a magnetic conductor 101 and a first spin accumulation portion 103 are in contact by way of a barrier layer 102. The magnetic conductor 101 has a body-centered cubic lattice structure typically represented by Fe, or a CoFeB alloy, and the barrier layer 102 has a body-centered cubic lattice structure typically represented by MgO or the like.

Further, the first spin accumulation portion 103 is a non-magnetic conductor having a body-centered cubic lattice structure and includes a single element comprising V, Nb, Ta, V, Cr, Mo or W, and a non-magnetic intermetallic compound containing at least one of elements of Ti, V, Nb, Ta, V, Cr, Mo, and W having a crystal symmetricity of $AB_2$ type structure, $AB_5$ type structure, $Fe_3Si$ type structure, or $DO_3$ type structure. Further, the non-magnetic conductor may also be (Ga, Mn)As, GaIn, TiN, TiO, or a non-magnetic conductive compound comprising them as a main ingredient.

When spin electrons (current Ic) flow from the magnetic conductor 101 having magnetization magnetically pinned to one direction by way of a barrier layer 102 to the first spin accumulation portion 103, spin electrons Is having magnetization information of the magnetic conductor 101 are injected into the first spin accumulation portion 103.

In this case, since the crystal structure in all of the magnetic conductor 101, the barrier layer 102, and the first spin accumulation portion 103 has a body-centered cubic lattice structure, tunnel electrons are injected to the first spin accumulation portion 103 with no scattering also at the boundary between the barrier layer 102 and the first spin accumulation portion 103.

For example, when pure Fe having a body-centered cubic lattice structure is used as the magnetic conductor 101, MgO oriented at bcc (001) is used as the barrier layer 102, and pure V having a body-centered cubic lattice structure is used as the first spin accumulation portion 103, electrons present in the Δ1 band of Fe conduct by tunneling in a coherent state through a thin MgO.

Further, since the crystal symmetricity is high, the spin electrons in the Δ1 band are injected as they are to V while keeping coherency with no diffusion. The injected spin electrons are accumulated in V within a range of the spin diffusion length.

As described above, by improving the crystal symmetricity, the spin injection efficiency is increased and, as a result, the spin polarization rate is improved. Accordingly, when this configuration is applied to the spin accumulation effect, increase in the output is expected.

Figure 2:
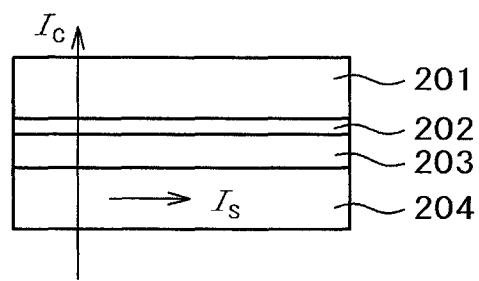
FIG. 2 is a schematic cross sectional view of a second spin injection element according to the first embodiment.

FIG. 2 is a schematic cross sectional view of a second spin injection element. The structure of the element generally comprises a magnetic conductor 201, a barrier layer 202, a first spin accumulation portion 203, a second spin accumulation portion 204. The magnetic conductor 201 and the barrier layer 202 are identical with those in FIG. 1 in which the first spin accumulation portion 203 is a non-magnetic conductor having a bcc crystal structure represented by V, Mo, W, etc. and the second spin accumulation portion 204 is a non-magnetic conductor having a face-centered cubic structure represented by Al, Cu, Ag, etc. However, the thickness of the first spin accumulation portion 203 is less than that of the spin diffusion length in the non-magnetic conductor having a crystal symmetricity of the body-centered cubic structure.

In this configuration, when spin electrons (current Ic) flow from the magnetic conductor 201 to the second spin accumulation portion 204 in the direction penetrating each of the layers, spin electrons are injected into the spin accumulation portion 203 in the same manner as in FIG. 1.

Since the thickness of the first spin accumulation portion 203 is less than the spin diffusion length in the non-magnetic conductor having the bcc crystal structure, the injected spin electrons Is are further injected in a coherent state as they are (without loosing spin information) into the second spin accumulation portion 204 to accumulate spin information.

Generally, since the spin diffusion length is longer in the non-magnetic conductor material of the second spin accumulation portion 204 than in the first spin accumulation portion 203, a second spin injection element has an advantage capable of transmitting the spin information in a wider range compared with the first spin injection element.

While the first spin accumulation portion has the bcc crystal structure and the second spin accumulation portion has the fcc crystal structure, since both of them comprise conductor materials, electron scattering at the boundary therebetween is negligible.

Figure 3:
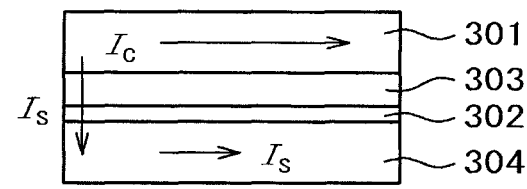
FIG. 3 is a schematic cross sectional view of a third spin injection element according to the first embodiment.

FIG. 3 shows a schematic cross sectional view of a third spin injection element. The element has a structure comprising a spin injecting non-magnetic conductor 301, a barrier layer 302, a first spin accumulation portion 303, and a second spin accumulation portion 304.

The spin injecting non-magnetic conductor 301 is a non-magnetic conductor having large spin interaction typically represented by Pt, Pd, etc. The barrier layer 302 is a thin insulator film having a body-centered cubic lattice structure, and both of the first spin accumulation portion 303 and the second spin accumulation portion 304 are non-magnetic conductors having the bcc crystal structure and both of them mainly comprise the materials shown in FIG. 1. Further, the thickness of the first spin accumulation portion 303 is less than the spin diffusion length of a non-magnetic conductor material having the body-centered cubic lattice structure.

When a current Ic flows in the direction of the film surface of the spin injecting non-magnetic conductor 301, the spin electrons Ic flow in the direction perpendicular to the film surface due to the effect of the spin track interaction. Generally, those having the crystal symmetricity of the face-centered cubic structure are known for the spin injecting non-magnetic conductor 301 and when the barrier layer 302 having the body-centered cubic lattice structure is used, the spin injection efficiency is lowered because of mismatching of crystals (low symmetricity of crystal structure). Therefore, the crystal symmetricity is improved by interposing the first spin accumulation portion 303 having the body-centered cubic lattice structure between the spin injecting non-magnetic conductor 301 and the barrier layer 302.

Further, by directly joining the second spin accumulation portion 304 having the body-centered cubic lattice structure to the barrier layer 302, scattering at the boundary between the barrier layer 302 and the second spin accumulation portion 304 can also be decreased. As described above, also in a case where the spin injecting source is a non-magnetic conductor, the spin polarization rate can be diffused.

Figure 4:
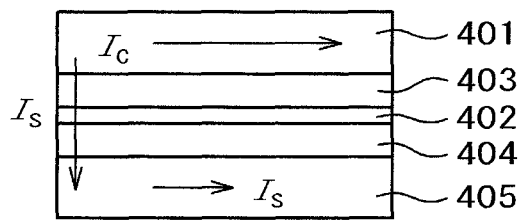
FIG. 4 is a schematic cross sectional view of a fourth spin injection element according to the first embodiment.

FIG. 4 shows a schematic cross sectional view of a fourth spin injection element. The element has a structure comprising a spin injecting non-magnetic conductor 401, a barrier layer 402, a first spin accumulation portion 403, a second spin accumulation portion 404, and a third spin accumulation portion 405.

The materials constituting the respective portions mainly comprise materials shown in FIG. 1. Further, the thickness of the first and the second spin accumulation portions are shorter than the spin diffusion length of the respective non-magnetic conductor materials having the body-centered cubic lattice structure. Further, compared with the materials for the first and the second spin accumulation portions, the spin diffusion length of the material for the third spin accumulation portion is made sufficiently longer.

In this configuration, the spin injecting element has the non-magnetic conductor as the spin injecting source like the spin injection element shown in FIG. 3, since the crystal structure of the spin injecting non-magnetic conductor 401 and that of the third spin accumulation portion 405 has the a fcc structure, lowering of the crystal symmetricity between the barrier layer and each of the boundaries is prevented by the first and the second spin accumulation portions having the body-centered cubic lattice structure.

Further, since the spin diffusion length in the third spin accumulation portion 405 is long, not only the spin information can be transmitted for a wide range, but also the output of the magnetic reproducing sensor applying this element can be improved.

Figure 5:
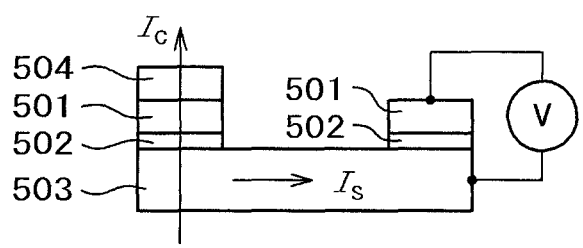
FIG. 5 is a schematic cross sectional view of a first spin accumulation element applying the first spin injection element according to the first embodiment.

FIG. 5 is a schematic sectional view of a first spin accumulation device (magnetic field sensor) applying the first spin injection element. A magnetic conductor 501, a barrier layer 502, a non-magnetic conductor 503, and an antiferromagnetic conductor 504 are shown. The components 501, 502, and 503 comprise the materials in FIG. 1 shown by references 101, 102, and 103 respectively, and the material for the antiferromagnetic conductor 504 comprises a material such as MnIr or MnPt.

In the drawing, assuming the stacked film on the left as a pinned portion and the stacked film on the right as a free portion, the direction of magnetization in the magnetic conductor 501 of the pinned portion is pinned magnetically in one direction by antiferromagnetic conductor 504 and the magnetic conductor 501 is in contact with the non-magnetic conductor 503 by way of the barrier layer 502.

Further, the magnetic conductor 501 in the free portion has a structure joined by way of the barrier layer 502 of the free portion within a range of the spin diffusion length of the magnetic conductor 501 and the non-magnetic conductor 503 of the pinned portion.

When spin electrons (current Ic) flow from the antiferromagnetic conductor 504 to the non-magnetic conductor 503, spin electrons Is directed in the direction of magnetization in the magnetic conductor 501 of the pinned portion are accumulated in the non-magnetic conductor 503 by the effect of the first spin injection element.

Therefore, a voltage difference is generated between the magnetic conductor 501 of the free portion and the non-magnetic conductor 503 depending on the direction of magnetization in the magnetic conductor 501 of the pinned portion and the magnetic conductor 501 of the free portion. Accordingly, when the magnetic conductor 501 of the pinned portion and the magnetic conductor 501 of the free portion are used as the pinned layer and the free layer respectively, the first spin accumulation device functions as a magnetic field (reproducing) sensor to an external magnetic field.

Figure 6:
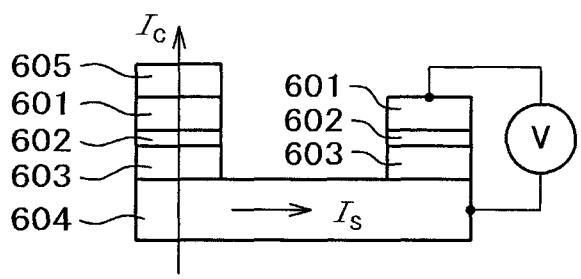
FIG. 6 is a schematic cross sectional view of a second spin accumulation element applying the second spin injection element according to the first embodiment.

FIG. 6 shows a second spin accumulation device (magnetic field sensor) applying the second spin injection element. A magnetic conductor 601, a barrier layer 602, a first spin accumulation portion 603, a second spin accumulation portion 604, an antiferromagnetic conductor 605 are shown.

The difference from the first spin accumulation device is that the non-magnetic conductor having the fcc structure (second spin accumulation portion) is used as the portion for accumulating spin electrons. While this functions as a magnetic field sensor to an external magnetic field in the same manner as the first spin accumulation device, the output voltage is improved since the spin diffusion length in the second spin accumulation portion 604 is longer. Further, it can be confirmed that the output voltage is improved by 4 times or more compared with a case of not using the first spin accumulation portion 603.

Figure 7:
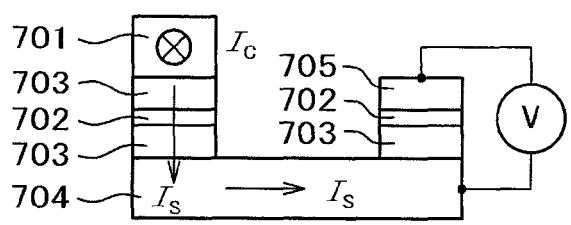
FIG. 7 is a schematic cross sectional view of a third spin accumulation element applying the fourth spin injection element according to the first embodiment.

FIG. 7 shows a third spin accumulation device (magnetic field sensor) applying the fourth spin injection element. A spin injecting non-magnetic conductor 701, a barrier layer 702, a first spin accumulation portion 703, a second spin accumulation portion 704, and a magnetic conductor 705 are shown. Materials for respective components are as described above, and the distance between the spin injecting non-magnetic conductor 701 and the magnetic conductor 705 is made less than the spin diffusion length in the second spin accumulation portion 704.

When current Ic flows to the spin injecting non-magnetic conductor 701, spin electrons Is are accumulated in the second spin accumulation portion 704. Further, since the magnetic conductor 705 is joined by way of the barrier layer 702 to the second spin accumulation portion 704, a voltage difference depending on the direction of the magnetic polarization of the accumulated spin electrons Is and the direction of the magnetization in the magnetic conductor 705 is generated between the magnetic conductor 705 and the second spin accumulation portion 704.

Accordingly, when the current Ic flows continuously in one direction, the spin injecting non-magnetic conductor 701 and the magnetic conductor 705 serve as the pinned layer and the free layer respectively, and the device functions as an external magnetic field sensor. The output signal of the external sensor has a value as large as twice or more when compared with a case of not applying the fourth spin injection element.

Figure 14:
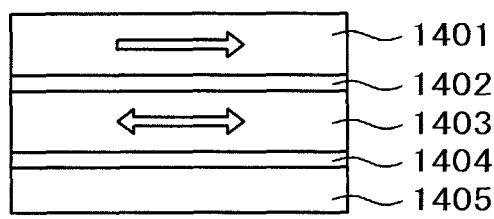
FIG. 14 is a schematic cross sectional view of a magnetic recording memory having a magnetization switching assisting mechanism applying the spin element according to the first embodiment.

FIG. 14 shows a magnetic recording memory having a magnetization switching assist mechanism using a spin injection element. A pinned layer 1401 comprising a magnetic conductor magnetically pinned in one direction, a first barrier layer 1402, a recording layer 1403 comprising a magnetic conductor, and a second barrier layer 1404 and a non-magnetic conductor 1405 are shown.

Materials for the pinned layer 1401 and the recording layer 1403 are magnetic conductor having a body-centered cubic lattice structure typically represented by Fe or a CoFeB alloy and materials for the first barrier layer 1402 and the second barrier layer 1404 are those having a body-centered cubic lattice structure typically represented, for example, by MgO.

Further, the non-magnetic conductor 1405 is a non-magnetic conductor having a body-centered cubic structure and includes single elements comprising V, Nb, Ta, V, Cr, Mo, and W, or non-magnetic intermetallic compounds including at least one of elements of Ti, V, Nb, Ta, V, Cr, Mo, W and having crystal symmetry of $AB_2$ type structure, $AB_5$ type structure, $Fe_3Si$ type structure, or $DO_3$ type structure. Further, the non-magnetic conductor 1405 may also be (Ga, Mn) As, GaIn, TiN, or TiO, or non-magnetic conductive compound comprising them as a main ingredient.

Figure 15:
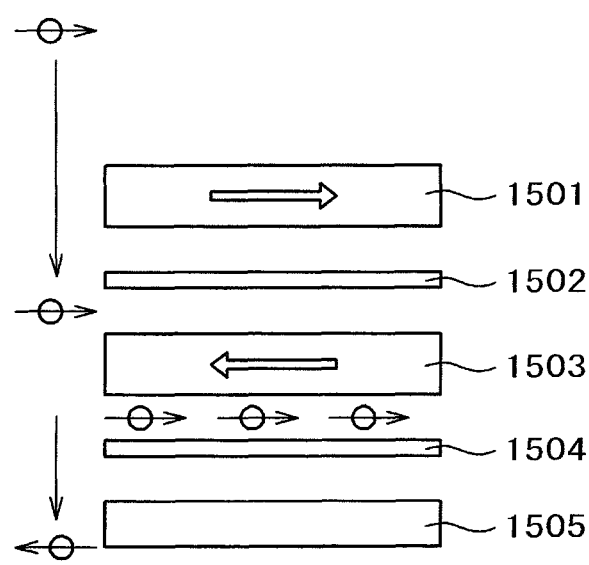
FIG. 15 is a view for explaining the operation principle of the magnetic recording memory having the magnetization switching assisting mechanism shown in FIG. 14.

FIG. 15 is a view showing the operation principle of the magnetic recording memory having the magnetization switching assist mechanism shown in FIG. 14. A pinned layer 1501 comprising a magnetic conductor magnetically pinned in one direction, a first barrier layer 1502, a recording layer 1503 comprising a magnetic conductor, a second barrier layer 1504, and a non-magnetic conductor 1505 are shown.

For example, when electrons move from the pinned layer 1501 to the non-magnetic conductor 1505, only the spin electrons in the direction identical with that of the magnetization in the pinned layer 1501 flow into the recording layer 1503. The spin electrons give a torque to the magnetization in the recording layer 1503 tending to cause magnetization switching.

On the other hand, spin electrons in the direction identical with that of the magnetization in the recording layer 1503 flow from the recording layer 1503 to the non-magnetic conductor 1505. As a result, spin electrons in the direction opposite to that of the magnetization in the recording layer 1503 are accumulated at the boundary between the recording layer 1503 and the second barrier layer 1504. A threshold current for the magnetization switching is decreased being assisted by the spin electrons.

As described above, according to this embodiment, a spin injection element of high spin injection efficiency, and a high output magnetic sensor and magnetic recording memory using the same can be provided.

Second Embodiment

A second embodiment is to be described with reference to FIG. 8, and FIG. 9AA to FIG. 9FC. Those matters described in the first embodiment and not described in this embodiment are identical with those in the first embodiment.

Figure 8:
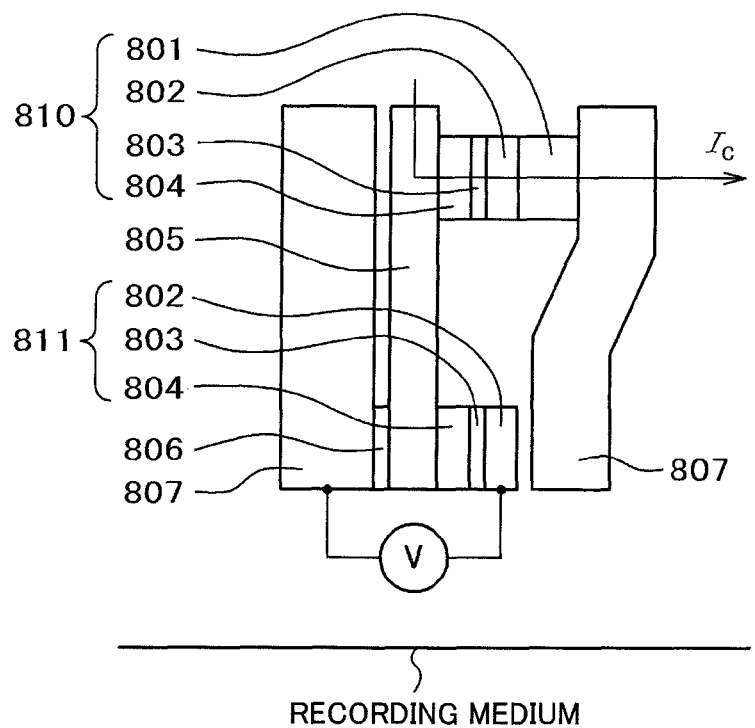
FIG. 8 is a schematic cross sectional view of a magnetic field sensor using the second spin accumulation element (FIG. 6) according to the second embodiment.
Figure 9A:
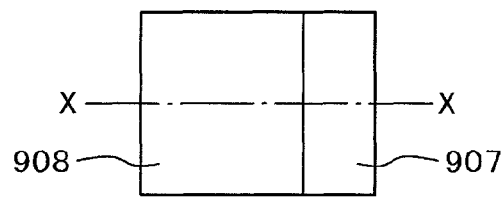
FIG. 9AA, FIG. 9AB, and FIG. 9AC are schematic views showing manufacturing steps of the magnetic field sensor using the second spin accumulation element according to the second embodiment in which FIG. 9AA is a plan view, FIG. 9AB is a cross sectional view along X-X in the plan view, and FIG. 9AC is a right side elevational view.
Figure 9A:
Figure 9A:
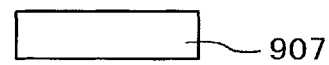

FIG. 8 is a schematic cross sectional view of a magnetic field sensor using the second spin accumulation device (FIG. 6) according to this embodiment, which is an example of applying to a first spin accumulation type reproducing head. Reference 801 shows an antiferromagnetic conductor, which uses a $Mn_3Ir$ alloy in this embodiment and is sized as $20(w) \times 100(h) \times 8(t)$ nm$^3$.

As the configuration of the pinned layer 810, the magnetic conductor 802 is formed of $Co_4Fe_4B_2$ and sized as $20(w) \times 100(h) \times 3(t)$ nm$^3$, the barrier layer 803 is formed of MgO and sized as $20(w) \times 100(h) \times 0.8(t)$ nm$^3$, and the first spin accumulation layer 804 is formed of V (vanadium) and sized as $20(w) \times 100(h) \times 0.5(t)$ nm$^3$.

As the configuration of the free layer 811, the magnetic conductor 802 is formed of $Co_4Fe_4B_2$ and sized as $20(w) \times 40(h) \times 3(t)$ nm$^3$, the barrier layer 803 is formed of MgO and sized as $20(w) \times 40(h) \times 0.8(t)$ nm$^3$, and the first spin accumulation layer 804 is formed of V (vanadium) and sized as $20(w) \times 40(h) \times 0.5(t)$ nm$^3$. The distance between the pinned layer 810 and free layer 811 is 50 nm.

The second spin accumulation layer 805 is formed of Cu and sized as $20(w) \times 500(h) \times 10(t)$ nm$^3$ and the magnetic shields 807 is formed of NiFe, respectively. The free layer 811 faces a recording medium, and an electric circuit for detecting a voltage difference between the free layer 811 and the magnetic shield 807 is provided.

Further, a terminal capable of applying a current from the magnetic shield 807 to the second spin accumulation layer 805 is provided on the side of the pinned layer 810. Reference 806 denotes a contact portion (non-magnetic conductor).

Then, a method of manufacturing the first spin accumulation type reproducing head is to be described. FIG. 9AA to FIG. 9FC are schematic views showing the steps of manufacturing a magnetic field sensor (first spin accumulation type reproducing head) using the second spin accumulation device in which FIGS. 9AA, 9BA, 9CA, 9DA, 9EA, and 9FA are plan views, FIGS. 9AB, 9BB, 9CB, 9DB, 9EB, and 9FB are cross sectional views along X-X in the plan views, and FIGS. 9AC, 9BC, 9CC, 9DC, 9EC, and 9FC are right side elevational views. Details for the manufacturing steps of the first spin accumulation type reproducing head are to be shown below.

First Step: Preparation of Magnetic Shield and Contact Hole (FIGS. 9AA, 9AB, and 9AC)

NiFe (100 nm thickness) is used for a magnetic shield 907 and an $Al_2O_3$ film (20 nm thickness) is used for an interlayer insulating film 908 and they are formed by a sputtering method respectively. A contact hole is formed by electron beam drawing and milling.

Figure 9B:
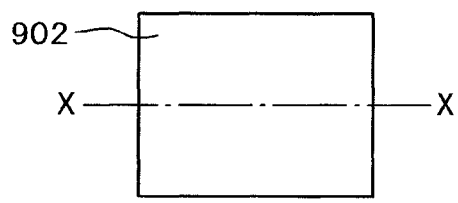
FIG. 9BA, FIG. 9BB, and FIG. 9BC are schematic views showing manufacturing steps of the magnetic field sensor using the second spin accumulation element according to the second embodiment in which FIG. 9BA is a plan view, FIG. 9BB is a cross sectional view along X-X in the plan view, and FIG. 9BC is a right side elevational view.
Figure 9B:
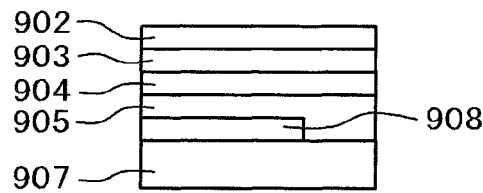
Figure 9B:
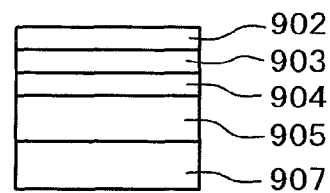

Second step: Formation of Non-Magnetic Layer—Barrier Layer—Magnetic Layer (FIGS. 9BA, 9BB, and 9BC)

Ta (3 nm) is stacked over the magnetic shield prepared in the first step, and thin films of Cu (10 nm) which is a second spin accumulation layer 905 having a face-centered cubic structure, V (0.5 nm) which is a first spin accumulation layer 904 having a body-centered cubic structure, MgO (0.8 nm) which is a barrier layer 903 having a body-centered cubic structure, and $Co_4Fe_4B_2$ (3 nm) which is a magnetic conductor 902 are stacked successively by a sputtering method in high vacuum (base pressure $1.0 \times 10^{-6}$ Pa or lower).

When V as the first spin accumulation layer 904 is stacked over Cu, a growing speed is set somewhat higher in order to grow a good body-centered cubic structure over the face-centered cubic structure, and it is formed by a rate of 1 nm/sec at a room temperature in this embodiment.

Figure 9C:
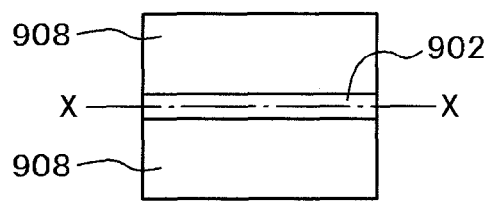
FIG. 9CA, FIG. 9CB, and FIG. 9CC are schematic views showing manufacturing steps of the magnetic field sensor using the second spin accumulation element according to the second embodiment in which FIG. 9CA is a plan view, FIG. 9CB is a cross sectional view along X-X in the plan view, and FIG. 9CC is a right side elevation view.
Figure 9C:
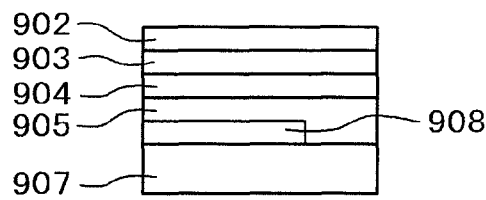
Figure 9C:
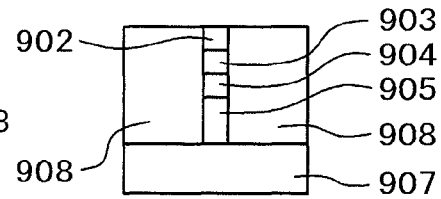

Third Step: Microprocessing for Fine Lines (FIGS. 9CA, 9CB, and 9CC)

Microprocessing for fine lines is conducted by using electron beam drawing and milling. In this embodiment, a fine line pattern at a line width of 20 nm is drawn and it is scraped off by milling till the magnetic shield. Then, both sides of the fine line are protected by $Al_2O_3$ which is an interlayer insulating film 908 and the pattern at the upper surface is exposed by a lift-off method.

Figure 9D:
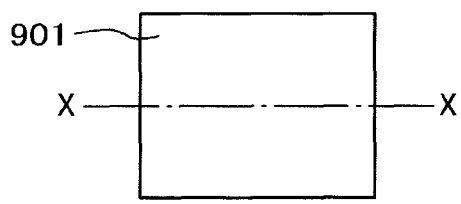
FIG. 9DA, FIG. 9DB, and FIG. 9DC are schematic views showing a manufacturing steps of the magnetic field sensor using the second spin accumulation element according to the second embodiment in which FIG. 9DA is a plan view, FIG. 9DB is a cross sectional view along X-X in the plan view, and FIG. 9DC is a right side elevational view.
Figure 9D:
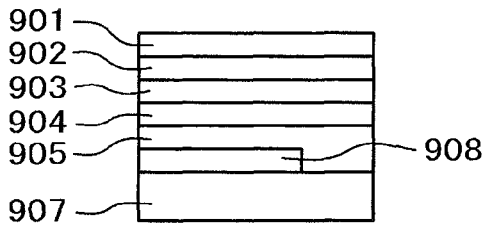
Figure 9D:
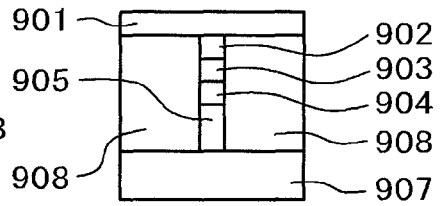

Fourth Step: Formation of Antiferromagnetic Film (FIGS. 9DA, 9DB, and 9DC)

$Mn_3Ir$ which is an antiferromagnetic conductor 901 is stacked on the fine line pattern prepared in the third step by a sputtering method. Before forming $Mn_3Ir$, the surface of the fine line is cleaned in vacuum.

Fifth Step: Fabrication of Free Layer and Pinned Layer (FIGS. 9EA, 9EB, and 9EC)

Pattern of a free layer and a pinned layer are fabricated by electron beam drawing method and milling. In this embodiment, a pattern of $20 \times 40$ nm$^2$ for the free layer and a pattern of $20 \times 100$ nm$^2$ for the pinned layer are fabricated. It is designed such that the distance between the free layer and the pinned layer is 50 nm. In this step, a pattern for various extension electrodes is also prepared.

Sixth Step: Preparation of Magnetic Shield and Contact Hole (FIGS. 9FA, 9FB, and 9FC)

$Al_2O_3$ which is an interlayer insulation film 908 is stacked over the element prepared in the fifth step. Then, a contact hole is formed on each of extension electrodes and then NiFe is formed as a magnetic shield 907 to 100 nm thickness.

A basic structure of a first spin accumulation type reproducing head is completed by the steps described above. Crystallinity for each of the layers formed by the method described above can be evaluated by a transmission microscope (TEM).

In this configuration, difference of the output voltage depending on the presence or absence of the first spin accumulation layer 804 was verified. In the existent configuration where V of the first spin accumulation layer 804 is not present, the output voltage was about: Vpp/1=0.12 mV/0.1 mA. Further, when spin polarization rate P is determined based on the dependence of the output voltage on the interelectrode distance, it is about: P=0.25.

When the value is compared with that of a TMR device using MgO, it was about one-half or less. It is estimated that this is caused by the difference of the crystal orientation property at the boundary between MgO and Cu and it is estimated that the polarization rate is lowered as a result.

On the other hand, as a result of applying the spin injection element having a high spin polarization rate according to this invention, the output voltage was increased to about 5 times as: Vpp/1=0.60 mV/0.1 mA. Further, when the spin polarization rate was determined in this case, P=0.55 and it is estimated that the output voltage was increased as a result of the improvement in the spin polarization rate.

Figure 12:
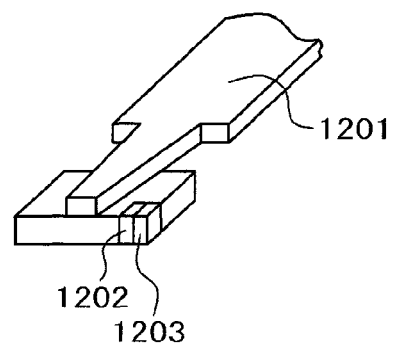
FIG. 12 is a schematic perspective view of a magnetic recording and reproducing head applying the magnetic field sensor according to the first embodiment or the second embodiment.

FIG. 12 is a schematic view of a magnetic recording and reproducing head having a first spin accumulation type reproducing head according to this embodiment mounted thereon. A slider 1201, a recording head 1202, and a reproducing head 1203 according to this embodiment are shown (FIG. 8).

Figure 13:
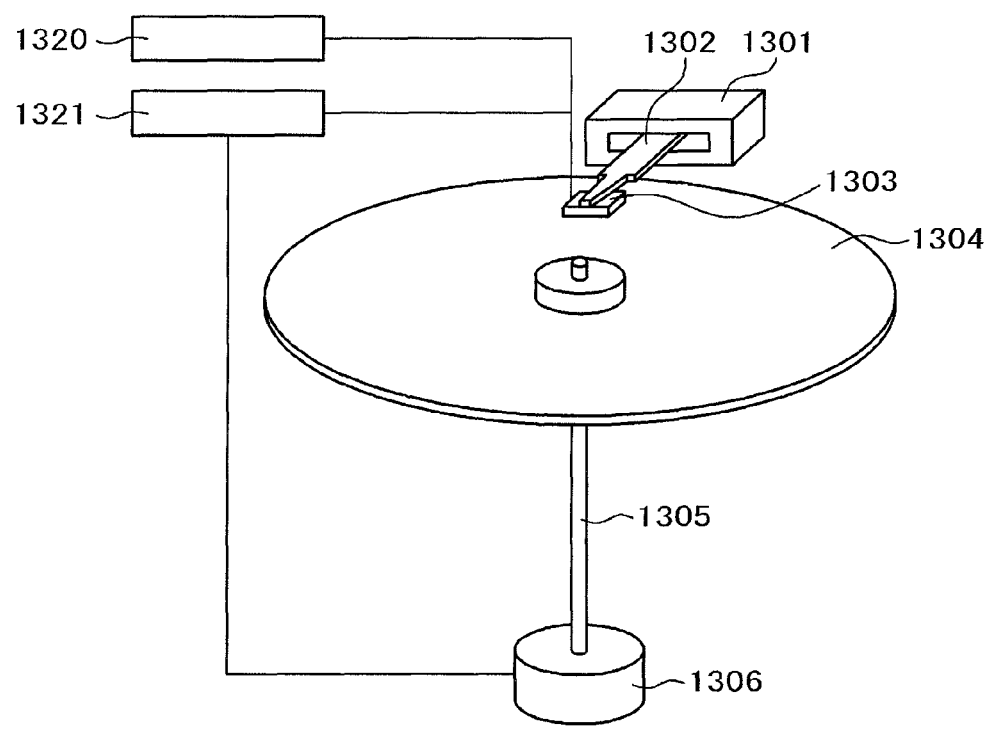
FIG. 13 is a schematic perspective view of a magnetic recording apparatus having the magnetic recording and reproducing head shown in FIG. 12.

FIG. 13 shows a magnetic recording apparatus including a magnetic recording medium 1304 having a magnetic recording layer such as a longitudinal recording continuous medium, a continuous perpendicular recording medium, a discrete medium, and a pattern medium, a driving unit 1306 for driving the recording medium, a driving transmission shaft 1305, the magnetic head 1303 shown in FIG. 12, an actuator 1301 and a slider 1302 for moving the magnetic head to a predetermined position above the magnetic recording medium, control means 1321 for controlling the magnetic head, the actuator, the slider, and the driving unit, and means 1320 for processing output signals from the magnetic head.

As described above according to this embodiment, the same effect as that in the first embodiment can be obtained. Further, a spin accumulation type reproducing head of high output can be provided. Further, a manufacturing method of a magnetic field sensor (first spin accumulation type reproducing head) (also including a manufacturing method of the spin injection element) can be provided.

Third Embodiment

A third embodiment is to be described with reference to FIG. 10, and FIG. 11AA to FIG. 11GC. Matters described in the first or second embodiment and not described in this embodiment are identical with those described above.

Figure 10:
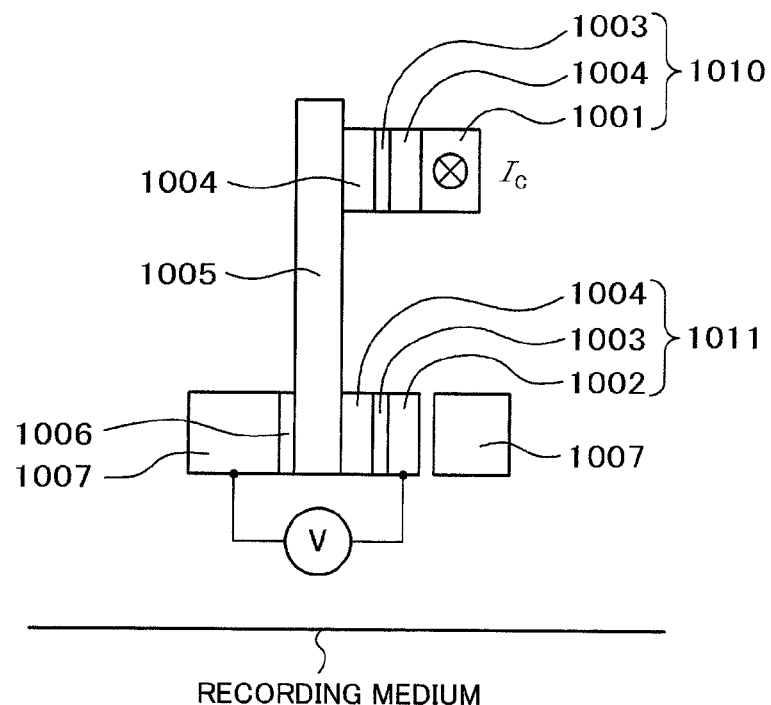
FIG. 10 is a schematic cross sectional view of a magnetic field sensor using the third spin accumulation element (FIG. 7) according to the third embodiment.
Figure 11A:
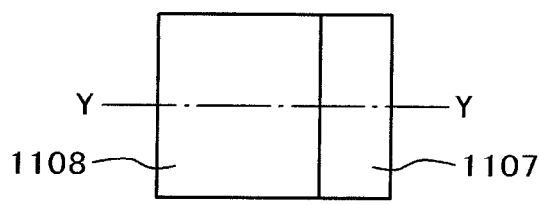
FIG. 11AA, FIG. 11AB, and FIG. 11AC are schematic views showing a manufacturing step of the magnetic sensor using the third spin accumulation element according to the third embodiment in which FIG. 11AA is a plan view, FIG. 11AB is a cross sectional view along X-X in the plan view, and FIG. 11AC is a right side elevational view.
Figure 11A:
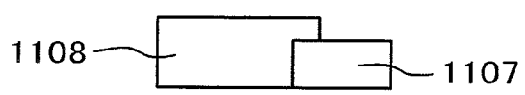
Figure 11A:
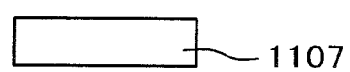

FIG. 10 is schematic cross sectional view of a magnetic field sensor using the third spin accumulation device (FIG. 7) according to this embodiment, which is an example applied to a second spin accumulation type reproducing head. Reference 1001 denotes a spin injection source comprising a non-magnetic conductor. In this embodiment, Pt is used at a size of $20(w) \times 100(h) \times 5(t)$ nm$^2$.

As the configuration of the pinned layer 1010, first spin accumulation layer 1004 is formed of V (vanadium) and sized as $20(w) \times 100(h) \times 0.5(t)$ nm$^3$, the material of the barrier layer 1003 is formed of MgO and sized as $20(w) \times 100(h) \times 0.8(t)$ nm$^3$.

As the configuration of the free layer 1011, the magnetic conductor 1002 is formed of $Co_4Fe_4B_2$ and sized as $20(w) \times 40(h) \times 3(t)$ nm$^3$, the barrier layer 1003 is formed of MgO and sized as $20(w) \times 40(h) \times 0.8(t)$ nm$^3$, the first spin accumulation layer 1004 is formed of V (vanadium) and sized as $20(w) \times 40(h) \times 0.5(t)$ nm$^3$. The distance between the pinned layer 1010 and free layer 1011 is 50 nm.

The second spin accumulation layer 1005 is formed of Cu and sized as $20(w) \times 500(h) \times 10(t)$ nm$^3$ and the magnetic shield 1007 is formed of NiFe, respectively. The free layer 1011 faces a recording medium, and an electric circuit for detecting a voltage difference between the free layer 1011 and the magnetic shield 1007 is provided. Further, the spin injecting non-magnetic electrode 1001 has a terminal capable of applying a current in the direction of the fine line. Reference 1006 denotes a contact portion (non-magnetic conductor).

Then, a method of manufacturing the second spin accumulation type reproducing head is to be described. FIG. 11AA to FIG. 11GC are schematic views showing the steps of manufacturing a magnetic field sensor using the second spin accumulation device in which (a) is a plan view, (b) is a cross sectional view along X-X in the plan view, and (c) is a right side elevational view. Details for the manufacturing steps of the first spin accumulation type reproducing head are to be shown below. This step is different from the step shown in the second embodiment and has a feature of preparing the free layer and the pinned layer separately.

First Step: Preparation of Magnetic Shield and Contact Hole (FIGS. 11AA, 11AB, and 11AC)

NiFe (100 nm thickness) is used for the magnetic shield 1107 and an $Al_2O_3$ film (20 nm thickness) is used for the interlayer insulating film 1108 and they are formed by a sputtering method respectively. A contact hole is formed by electron beam drawing and milling.

Second Step: Formation of Multi-Layered Film for Free Layer (FIGS. 11BA, 11BB, and 11BC)

Ta (3 nm) is stacked over the magnetic shield prepared in the first step, and thin films of Cu (10 nm) which is a second spin accumulation layer 1105 having a face-centered cubic structure, V (0.5 nm) which is a first spin accumulation layer 1104 having a body-centered cubic structure, MgO (0.8 nm) which is a barrier layer 1103 having a body-centered cubic structure, and $Co_4Fe_4B_2$ (3 nm) which is a magnetic conductor 1102 are stacked by a sputtering method. In the same manner as in the first embodiment, V which is the first spin accumulation layer 1104 is formed at a rate of 1 nm/sec.

Third Step: Microprocessing for Fine Lines (FIGS. 11CA, 11CB, and 11CC)

Microprocessing for fine lines is conducted by using electron beam drawing and milling. In this embodiment, a fine line pattern at a line width of 20 nm is drawn and it is scraped off by milling till the magnetic shield. Then, both sides of the fine line are protected by $Al_2O_3$ which is an interlayer insulating film 1108.

Fourth Step: Fabrication of Pinned Layer (FIGS. 11DA, 11DB, and 11DC)

A pattern for the free layer is fabricated by an electron beam drawing method and milling. In this embodiment, a pattern of $20 \times 40$ nm$^2$ was fabricated for the free layer. In this step, pattern for various extension electrodes is also prepared.

Fifth Step: Formation of Film for Pinned Layer (FIGS. 11EA, 11EB, and 11EC)

A contact hole for forming a pinned layer is formed over the interlayer insulation film $Al_2O_3$ formed in the third step at a position 50 nm from the end of the free layer. Then, a fine line portion joined with the pinned layer is cleaned in vacuum and V (0.5 nm) which is the first spin accumulation layer 1104, MgO (0.8 nm) which is the barrier layer 1103 having a body-centered cubic structure, V (0.5 nm) which is the first spin accumulation layer 1104 having a body-centered cubic structure, and a thin film of Pt (5 nm) which is the spin injection source 1101 comprising a non-magnetic conductor are stacked by a sputtering method.

Figure 11F:
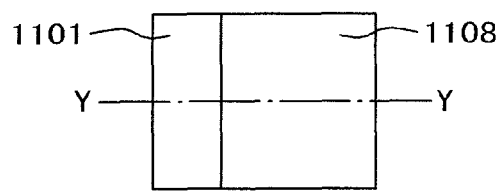
FIG. 11FA, FIG. 11FB, and FIG. 11FC are schematic views showing manufacturing steps of the magnetic sensor using the third spin accumulation element according to the third embodiment in which FIG. 11FA is a plan view, FIG. 11FB is a cross sectional view along X-X in the plan view, and FIG. 11FC is a right side elevational view.
Figure 11F:
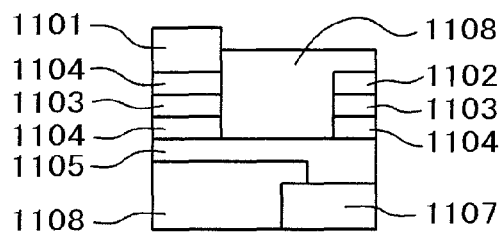
Figure 11F:
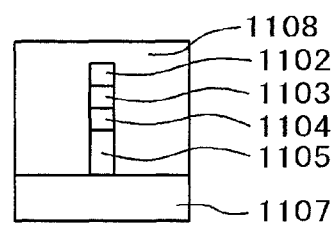
Figure 11G:
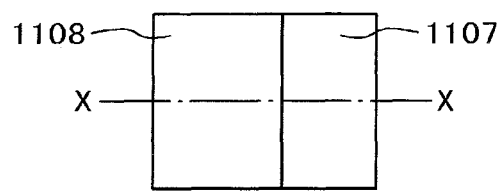
FIG. 11GA, FIG. 11GB, and FIG. 11GC are schematic views showing manufacturing steps of the magnetic sensor using the third spin accumulation element according to the third embodiment in which FIG. 11GA is a plan view, FIG. 11GB is a cross sectional view along X-X in the plan view, and FIG. 11GC is a right side elevational view.
Figure 11G:
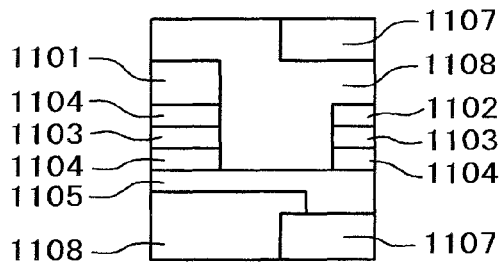
Figure 11G:
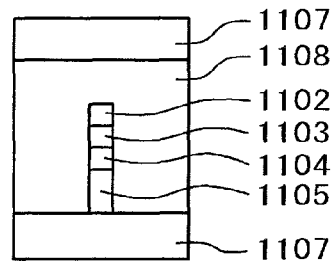

Sixth Step: Fabrication of Pinned Layer (FIGS. 11FA, 11FB, and 11FC)

A pattern for the pinned layer was fabricated by an electron beam drawing method and milling. In this embodiment, a pattern of 20×100 nm² was fabricated for the pinned layer. It is designed such that the distance between the free layer and the pinned layer is 50 nm. In this step, pattern for various extension electrodes is also prepared.

Seventh Step: Preparation of Magnetic Shield and Contact Hole (FIGS. 11GA, 11GB, and 11GC)

$Al_2O_3$ which is the interlayer insulation film 1108 is stacked over the element prep-red in the sixth step. Then, a contact hole is formed on various extension electrodes and then NiFe is formed as a magnetic shield 1107 to 100 nm thickness.

A basic structure of a second spin accumulation type reproducing head is completed by the steps described above.

In this configuration, difference of the output voltage depending on the presence or absence of the first spin accumulation layer 1004 was verified. In the existent configuration where V of the first spin accumulation layer 1004 is not present, the output voltage was about: Vpp/1=0.012 mV/0.1 mA. Further, when the spin polarization rate P is determined based on the dependence of the output voltage on the interelectrode distance, it is about: P=0.25.

On the other hand, as a result of applying the spin injection element having a high spin polarization rate according to this invention, the output voltage was increased by about twice to: Vpp/1=0.026 mV/0.1 mA. Further, when the spin polarization rate was determined in this case, it was: P=0.55 and it is estimated that the output voltage was increased as a result of the improvement in the spin polarization rate like the first embodiment.

FIG. 12 is a schematic view of a magnetic recording and reproducing head having a second spin accumulation type reproducing head according to this embodiment mounted thereon. A slider 1201, a recording head 1202 and a reproducing head 1203 according to this embodiment are shown (FIG. 10).

As described above according to this embodiment, the same effect as that in the first embodiment can be obtained. Further, a spin accumulation type reproducing head of high output can be provided. Further, a manufacturing method of a magnetic field sensor (second spin accumulation type reproducing head) (also including a manufacturing method of the spin injection element) can be provided.

Fourth Embodiment

A fourth embodiment is to be described with reference to FIG. 16 to FIG. 18. Matters described in the first, second or third embodiment and not described in this embodiment are identical with those described above.

FIG. 16 shows a magnetic recording memory having an initialization mechanism for recording information using a spin injection element. An antiferromagnetic conductor 1601, a magnetic conductor 1602, a barrier layer 1603, a first spin accumulation portion 1604, a second spin accumulation portion 1605, a recording layer 1606, and a pinned layer 1607 are shown.

For the antiferromagnetic conductor 1601, the magnetic conductor 1602, the barrier layer 1603, the first spin accumulation portion 1604, and the second spin accumulation portion 1605, the materials described above are selected. The material for the recording layer 1606 and the pinned layer 1607 comprise a magnetic conductor having a body-centered cubic lattice structure such as Fe or CoFeB, or a stacked ferri structure using the same.

The first spin injection element structure comprising the stacked films 1601, 1602, 1603, and 1604 on the left of the drawing is referred to as an initialization mechanism 1610, and the structure of the stacked films 1601, 1607, 1603, and 1606 on the right of the drawing is referred to as a TMR cell 1620.

Reference 1601 represents an antiferromagnetic conductor. In this embodiment, an $Mn_3Ir$ alloy is used and sized as 45(w)×150(d)×8(t) nm³. In the configuration of the initialization mechanism 1610, the magnetic conductor 1602 is formed of $Co_2Fe_3B_2$ and sized as 45(w)×150(d)×3(t) nm³, the barrier layer 1603 is formed of MgO and sized as 45(w)×150(d)×0.8(t) nm³, and the first spin accumulation layer 1604 is formed of V (vanadium) and sized as 45(w)×150(d)×0.5(t) nm³.

In the configuration of the TMR cell 1620, the antiferromagnetic conductor 1601 is formed of an $Mn_3Ir$ alloy and sized as 45(w)×90(d)×8(t) nm³, the magnetic conductor 1602 is formed of $Co_2Fe_6B_2$ and sized as 45(w)×90(d)×3(t) nm³, the barrier layer 1603 is formed of MgO and sized as 45(w)×90(d)×0.8(t) nm³, and the first spin accumulation layer 1604 is formed of V (vanadium) and sized as 45(w)×90(d)×0.5(t) nm³. Further, the distance between the initialization mechanism 1610 and the TMR cell 1620 is 50 nm.

The second spin accumulation layer 1605 is formed of Cu and sized as 45(w)×300(d)×10(6) nm³, and a terminal capable of applying a current from the antiferromagnetic layer 1601 to the second spin accumulation layer 1605 is provided on the side of the initialization mechanism 1610.

The direction of magnetization in the pinned layer 1601 of the initialization mechanism and that in the layer 1601 of the TMR cell are made identical. Further, the portion for the TMR cell 1620 is joined to the second spin accumulation portion by way of the third barrier layer 1603, and magnetization switching is caused to the magnetization of the recording layer 1606 by the accumulated spin electrons.

Usually, in the initialization of the magnetic recording memory, a current is applied to each TMR device to switch the magnetization and align the direction of the magnetization in the recording layer 1606. However, when the integration degree of the magnetic recording memory is increased and the size of the TMR cell is reduced, a threshold current causing magnetization switching increases. On the other hand, when the magnetization switching mechanism due to spin electrons is added, magnetization is switched by the spin electrodes and, as a result, initialization can be conducted at a threshold current value or lower.

In this configuration, the magnitude of the threshold current for erasing the magnetic information due to the presence or absence of the initialization mechanism 1610 was verified. The threshold current density was about: $Jc=1×10^6$ A/m² in the existent configuration with no initialization mechanism 1610, whereas this could be decreased as low as: $Jc=8×10^5$ A/m² in a case of providing the initialization mechanism 1610. This is estimated to be attributable to the magnetization switching assistance by the spin electrons.

As described above, the threshold current for initialization can be decreased by using the spin injection element according to this embodiment.

Further, since recording information of a number of TMR cells can be initialized simultaneously, the initialization step can be simplified. Then, the operation principle is to be explained with reference to the succeeding drawings.

In FIGS. 17A and 17B show an erasing mechanism for the magnetic recording memory. At first, upon recording (FIG. 17A), magnetic information in the recording layer is rewritten by flowing a current J at or higher than threshold current Jc (J>Jc) to each of TMR cells 1702. Then, by detecting the resistance of the TMR cell, information written into each of the cells can be read.

Then, in the initialization (erasing) step (FIG. 17B), current is supplied to each of the cells at or lower than the level of a threshold current that causes magnetization switching (J>Jc). When the current is supplied also on the side of the initialization mechanism 1701, spin electrons are accumulated in the second spin accumulation portion. Since the accumulated spin electrons assist magnetization switching in the recording layer, the threshold current for initialization is reduced as a result.

Figure 18:
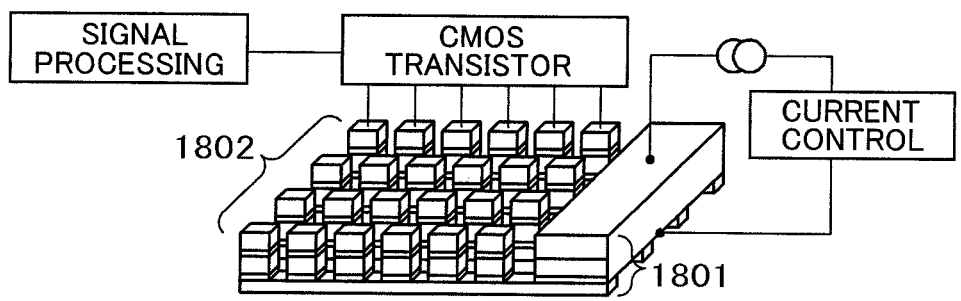
FIG. 18 is a schematic perspective view of a magnetic recording memory array having an initialization mechanism applying the spin device according to the first embodiment.

FIG. 18 shows a schematic view of a magnetic recording device having the initialization mechanism according to this embodiment. An initialization mechanism 1801 is connected to each of the TMR cells by way of the spin accumulation portion and has terminals capable of applying the current. Further, a cell array 1802 can be controlled for the current by CMOS transistors respectively. With such a configuration, not only the threshold current for initialization can be decreased but also the entire cell can be initialized at once.

The initialization mechanism can be disposed on every row of plural TMR cells. The distance between each of the initialization mechanisms depends on the diffusion length of spin electrons in the second spin accumulation layer. For example, for a diffusion length of 1 μm, when the width of the TMR cell is 50 nm and the distance between each of the TMR cells is 50 nm, the initialization mechanism can be functioned effectively by disposing the initialization mechanism on every ten rows of the TMR cells.

According to this embodiment, the same effect as that in the first embodiment can be obtained. Further, by the provision of the initialization mechanism using the spin injection element of high spin injection efficiency, a magnetic recording memory with low threshold current for initialization can be provided.

As described above, by using the spin injection element of a high polarization rate to the non-magnetic body shown in the embodiments described above, a high output spin accumulation type magnetic field sensor or the magnetic recording memory capable of decreasing the threshold current for switching magnetization can be realized.

Reference Sings List
101 magnetic conductor layer
102 barrier layer
103 first spin accumulation portion (non-magnetic conductor),
201 magnetic conductor layer
202 barrier layer
203 first spin accumulation portion (non-magnetic conductor)
204 second spin accumulation portion (non-magnetic conductor)
301 spin injecting non-magnetic conductor layer
302 barrier layer
303 first spin accumulation portion (non-magnetic conductor)
304 second spin accumulation portion (non-magnetic conductor)
401 spin injecting non-magnetic conductor layer
402 barrier layer
403 first spin accumulation portion (non-magnetic conductor)
404 second spin accumulation portion (non-magnetic conductor)
405 third spin accumulation portion (non-magnetic conductor)
501 magnetic conductor layer
502 barrier layer
503 non-magnetic conductor layer (spin accumulation portion)
504 antiferromagnetic conductor layer,
601 magnetic conductor layer,
602 barrier layer
603 first spin accumulation portion (non-magnetic conductor)
604 second spin accumulation portion (non-magnetic conductor)
605 antiferromagnetic conductor layer
701 spin injecting non-magnetic conductor layer,
702 barrier layer
703 first spin accumulation portion (non-magnetic conductor)
704 second spin accumulation portion (non-magnetic conductor)
801 antiferromagnetic conductor layer
802 magnetic conductor layer
803 barrier layer,
804 first spin accumulation layer (non-magnetic conductor)
805 second spin accumulation layer (non-magnetic conductor)
806 contact portion (non-magnetic conductor)
807 magnetic shield
810 pinned layer
811 free layer
901 antiferromagnetic conductor layer
902 magnetic conductor layer
903 barrier layer
904 first spin accumulation layer (no-magnetic conductor)
905 second spin accumulation layer (non-magnetic conductor)
907 magnetic shield
908 interlayer insulation film
1001 spin injecting source (non-magnetic conductor),
1002 magnetic conductor layer
1003 barrier layer
1004 first spin accumulation layer (non-magnetic conductor)
1005 second spin accumulation layer (non-magnetic conductor)
1006 contact portion (non-magnetic conductor)
1007 magnetic shield
1010 pinned layer
1011 free layer
1101 spin injecting source (non-magnetic conductor)
1102 magnetic conductor layer
1103 barrier layer
1104 first spin accumulation layer (non-magnetic conductor)
1105 second spin accumulation layer (non-magnetic conductor)
1107 magnetic shield
1108 interlayer insulation layer
1201 slider 1202 recording head
1203 reproducing head
1301 actuator
1302 slider
1303 magnetic head
1304 magnetic recording medium
1305 driving transmission shaft
1306 driving unit
1320 means for processing output signals from the magnetic head
1321 control means for controlling a magnetic head, an actuator, a slider, and a driving unit
1401 pinned layer
1402 first barrier layer
1403 recording layer (magnetic conductor)
1404 second barrier layer
1405 non-magnetic conductor layer
1501 pinned layer
1502 first barrier layer
1503 recording layer (magnetic conductor)
1504 second barrier layer
1505 non-magnetic conductor layer
1601 antiferromagnetic conductor layer
1602 magnetic conductor layer
1603 barrier layer
1604 first spin accumulation layer (non-magnetic conductor)
1605 second spin accumulation layer (non-magnetic conductor)
1606 recording layer (magnetic conductor)
1607 pinned layer
1610 initialization mechanism portion
1620 TMR cell
1701 initialization mechanism portion
1702 TMR cell
1801 initialization mechanism portion
1802 cell array

The invention claimed is:

1. A spin injection element comprising:
a non-magnetic conductor layer,
a barrier layer stacked over the non-magnetic conductor layer,
a magnetic conductor layer stacked over the barrier layer, and
a circuit for flowing a current between the magnetic conductor layer and the non-magnetic conductor layer, wherein
the boundary between the non-magnetic conductor layer and the barrier layer, and the boundary between the magnetic conductor layer and the barrier layer have a structure where they are in contact each at a surface having a crystal symmetricity.

2. The spin injection element according to claim 1, wherein the structure contacting each at the surface having the crystal symmetricity efficiently injects spin electrons from the barrier layer to the non-magnetic conductor layer.

3. The spin injection element according to claim 1, wherein the non-magnetic conductor layer and the barrier layer contain a body-centered cubic lattice structure or a NaCl type crystal structure.

4. The spin injection element according to claim 3, wherein the circuit for flowing the current controls spin electrons injected to the non-magnetic conductor layer.

5. The spin injection element according to claim 3, wherein the non-magnetic conductor layer comprises a single element of V, Nb, Ta, Cr, Mo, or W, or a non-magnetic intermetallic compound having an $AB_2$ type structure, an $AB_5$ type structure, a $Fe_3Si$ type structure or a $DO_3$ type structure containing at least one of the elements described above.

6. The spin injection element according to claim 3, wherein the non-magnetic conductor layer comprises (Ga, Mn)As, GaIn, TiN, TiO, or a non-magnetic conductive compound comprising them as a main ingredient.

7. The spin injection element according to claim 3, wherein the non-magnetic conductor layer has a first non-magnetic conductor layer and a second non-magnetic conductor layer adjacent to each other, and
the first non-magnetic conductor layer adjacent with the barrier layer has a body-centered cubic lattice structure or a NaCl type crystal structure, the thickness thereof is less than the spin diffusion length in the first non-magnetic conductor layer, and the spin diffusion length in the second non-magnetic conductor layer is longer than the spin diffusion length in the first non-magnetic conductor layer.

8. A spin injection element comprising:
a first non-magnetic conductor layer,
a second non-magnetic conductor layer stacked over the first non-magnetic conductor layer,
a barrier layer having a body-centered cubic lattice structure and laminated over the second non-magnetic conductor layer,
a third non-magnetic conductor layer stacked over the barrier layer,
a fourth non-magnetic conductor layer of a large atomic number stacked over the third non-magnetic conductor layer, and
a circuit for supplying a current in the direction of the film surface of the fourth non-magnetic conductor layer, wherein
the second non-magnetic conductor layer has a body-centered cubic lattice structure of a thickness less than the spin diffusion length in the second non-magnetic conductor layer, and
the third non-magnetic conductor layer has a body-centered cubic lattice structure of a thickness less than the spin diffusion length in the third non-magnetic conductor layer.

9. The spin injection element according to claim 8, wherein the fourth non-magnetic conductor layer of a large atomic number contains Pt or Pd.

10. A magnetic field sensor comprising:
a first non-magnetic semiconductor layer,
a pinned layer in which a second non-magnetic conductor layer having a body-centered cubic lattice structure, a first barrier layer having a body-centered cubic structure, and a first magnetic conductor layer magnetically pinned in one direction are stacked in this order over a first region of the first non-magnetic conductor layer,
a free layer in which a third non-magnetic conductor layer having a body-centered cubic lattice structure, a second barrier layer having a body-centered cubic lattice structure, and a second magnetic conductor layer where the direction of magnetization changes by the external magnetic field are stacked in this order over a second region of the first non-magnetic conductor layer,
a current applying circuit for flowing a current between the first magnetic conductor layer and the first non-magnetic conductor layer, and
an electric circuit for detecting a potential difference between the first non-magnetic conductor layer and the second magnetic conductor layer, wherein the first region and the second region are disposed within the range of the spin diffusion length in the first non-magnetic conductor layer.

11. A magnetic recording memory comprising:
a non-magnetic conductor layer having a body-centered cubic structure,
a stacked film comprising a first barrier layer having a body-centered cubic lattice structure and stacked over the non-magnetic conductor layer, a first magnetic conductor layer having a body-centered cubic structure and stacked over the first barrier layer, a second barrier layer having a body-centered cubic lattice structure and stacked over the first magnetic conductor layer, and a second magnetic conductor layer having a body-centered cubic structure and stacked over the second barrier layer, and
a current supplying circuit for flowing a current between the non-magnetic conductor layer and the second magnetic conductor layer, wherein
the thickness of the non-magnetic conductor layer is less than the spin diffusion length in the non-magnetic conductor layer and magnetization in the second magnetic conductor layer is magnetically pinned in one direction and
spin electrons injected to the boundary between the first barrier layer and the first magnetic conductor layer assist the switching of magnetization in the first magnetic conductor layer.

12. A magnetic recording memory comprising:
a first non-magnetic conductor layer,
an initialization mechanism portion including stacked films where a second non-magnetic conductor layer having a body-centered cubic lattice structure, a first barrier layer having a body-centered cubic lattice structure, and a first magnetic conductor layer magnetically pinned in one direction stacked in this order and electrode terminals disposed to each of the first magnetic conductor layer and the first non-magnetic conductor layer for flowing a current between the layers over a first region of the first non-magnetic conductor layer, and
a plurality of memory cells disposed within a range of the spin diffusion length in the first non-magnetic layer over a second region of the first non-magnetic layer.

13. The magnetic recording memory according to claim 12, wherein
the memory cell is disposed over the second barrier layer having the body-centered cubic structure, and
the second barrier layer is stacked over a third-non-magnetic conductor layer having the body-centered cubic lattice structure and stacked over the second region of the first non-magnetic conductor layer.

14. The magnetic recording memory according to claim 12, wherein
the initialization mechanism portion is disposed in plurality.

* * * * *